(12) United States Patent
McCormick et al.

(10) Patent No.: US 6,593,690 B1
(45) Date of Patent: Jul. 15, 2003

(54) LARGE AREA ORGANIC ELECTRONIC DEVICES HAVING CONDUCTING POLYMER BUFFER LAYERS AND METHODS OF MAKING SAME

(75) Inventors: Fred Boyle McCormick, Maplewood, MN (US); George David Vernstrom, Saint Paul, MN (US); Yong Hsu, Woodbury, MN (US); Russell Dean Birkholz, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/389,926

(22) Filed: Sep. 3, 1999

(51) Int. Cl.[7] .............................................. H05B 33/00
(52) U.S. Cl. ...................... 313/506; 313/512; 428/917
(58) Field of Search ................. 313/502, 503, 313/504, 506, 512; 428/917; 257/102; 375/169.3

(56) References Cited

U.S. PATENT DOCUMENTS

| | | | |
|---|---|---|---|
| 4,748,043 A | 5/1988 | Seaver et al. .................. 427/30 |
| 4,791,881 A | 12/1988 | Iwasaki ....................... 118/244 |
| 4,984,532 A | 1/1991 | Winters ....................... 118/242 |
| 5,061,569 A | 10/1991 | Van Slyke et al. .......... 428/457 |
| 5,250,163 A | * 10/1993 | Epstein et al. .......... 204/153.21 |
| 5,270,079 A | 12/1993 | Bok ............................ 427/429 |
| 5,317,169 A | 5/1994 | Nakano et al. ................ 257/40 |
| 5,368,894 A | 11/1994 | Lammers et al. ......... 427/407.1 |
| 5,374,489 A | 12/1994 | Imai et al. ................... 428/690 |
| 5,563,424 A | 10/1996 | Yang et al. .................... 257/40 |
| 5,574,291 A | 11/1996 | Dodabalapur et al. ........ 257/40 |
| 5,596,208 A | 1/1997 | Dodabalapur et al. ........ 257/66 |
| 5,644,327 A | * 7/1997 | Onyskevych et al. ....... 313/503 |
| 5,707,745 A | 1/1998 | Forrest et al. .............. 428/432 |
| 5,719,467 A | 2/1998 | Antoniadis et al. ......... 313/506 |
| 5,747,182 A | 5/1998 | Friend et al. ............... 428/690 |
| 5,747,183 A | 5/1998 | Shi et al. ..................... 428/690 |
| 5,756,224 A | 5/1998 | Borner et al. ............... 428/690 |
| 5,798,170 A | 8/1998 | Zhang et al. ................ 428/212 |
| 5,844,363 A | 12/1998 | Gu et al. ..................... 313/506 |
| 5,858,561 A | 1/1999 | Epstein et al. .............. 428/690 |
| 5,869,350 A | 2/1999 | Heeger et al. ................. 438/29 |
| 5,932,363 A | 8/1999 | Hu et al. ..................... 428/690 |
| 6,140,756 A | * 10/2000 | Hosotani ..................... 313/461 |
| 6,235,414 B1 | * 5/2001 | Epstein et al. .............. 428/690 |

FOREIGN PATENT DOCUMENTS

| | | |
|---|---|---|
| EP | 0 443 861 A2 | 8/1991 |
| WO | WO 89/12376 | 12/1989 |
| WO | WO 90/04256 | 4/1990 |
| WO | WO 95/24056 | 9/1995 |
| WO | WO 96/33593 | 10/1996 |
| WO | WO 98/01909 | 1/1998 |
| WO | WO 98/06123 | 2/1998 |
| WO | WO 98/10473 | 3/1998 |
| WO | WO 98/57525 | 12/1998 |

OTHER PUBLICATIONS

C.H. Chen, J. Shi, and C.W. Tang "Recent Development in Molecular Organic Electroluminescent Materials", *Macromolecular Symposia*, 1997, 125, pp 1–48.

(List continued on next page.)

*Primary Examiner*—Ashok Patel

(57) ABSTRACT

Large area organic electronic devices having a doped conducting polymer buffer layer are described. Methods for applying a doped conducting polymer buffer layer to an electrode-coated large area substrate are described. The methods include web coating techniques such as microgravure coating or meniscus coating, which may be used in continuous coating processes.

7 Claims, 1 Drawing Sheet

OTHER PUBLICATIONS

J. Kido, "Organic Electroluminescent devices Based on Polymeric Materials", *Trends in Polymer Science*, vol. 2, No. 10, Oct. 1994, pp. 350–355.

J.J.M. Halls, D. R. Baigent, F. Cacialli, N.C. Greenham, R.H. Friend, S.C. Moratti, and A. B. Holmes, "Light–emitting and Photoconductive Diodes Fabricated with Conjugated Polymers", *Thin Solid Films*, 1996, 276, pp. 13–20.

Q. Pei, Y. Yang, G. Yu, C. Zhang, and A. J. Heeger, "Polymer Light–Emitting Electrochemical Cells: In Situ Formation of a Light–Emitting p–n Junction", *Journal of the American Chemical Society*, 1996, 118, pp. 3922–3929.

Z. Shen, P. E. Burrows, V. Bulovic, S. R. Forrest, and M. E. Thompson, "Three–Color, Tunable, Organic Light–Emitting Devices", *Science*, Jun. 27, 1997, vol. 276, pp. 2009–2011.

H. Antoniadis, M. R. Hueschen, J. N. Miller, R. L. Moon, D. B. Roitman, and J. R. Sheats, "Failure Modes in Vapor–Deposited Organic LEDs", *Macromol Symp.*, 125, 1997, pp. 59–67.

S. Karg, J. C. Scott, J. R. Salem, M. Angelopoulos, "Increased Brightness and Lifetime of Polymer Light–Emitting Diodes with Polyaniline Anodes", *Synthetic Metals*, 80 (1996) pp. 111–117.

S. A. Carter, M. Angelopoulos, S. Karg, P. J. Brock, and J. C. Scott, "Polymeric Anodes for Improved Polymer Light-Emitting Diode Performance", *Appl. Phys. Lett.* 70 (16), Apr. 21, 1997, pp. 2067–2069.

G. Gustafsson, G. M. Treacy, Y. Cao, F. Klavetter, N. Colaneri, and A. J. Heeger, "The "Plastic" LED: A Flexible Light–Emitting Device Using A Polyaniline Transparent Electrode" *Synthetic Metals*, 55–57, (1993) pp. 4123–4127.

J. Chung, B. Choi, and H. H. Lee, "Polyaniline and Poly(n-vinylcarbazole) Blends As Anode For Blue Light–Emitting Diodes", *Applied Physics Letters*, vol. 74, No. 24, Jun. 14, 1999, pp. 3645–3647.

\* cited by examiner

LARGE AREA ORGANIC ELECTRONIC DEVICES HAVING CONDUCTING POLYMER BUFFER LAYERS AND METHODS OF MAKING SAME

TECHNICAL FIELD

This invention relates to conducting buffer layers for organic electronic devices and in particular for organic light emitting diodes (OLED)s including flexible, large area OLEDs. The invention also relates to methods for applying the buffer layer.

BACKGROUND

Organic electronic devices are articles that include layers of organic materials, at least one of which can conduct an electric current. An example of an organic electronic device is an organic light emitting diode (OLED). OLEDs, sometimes referred to as lamps, are desirable for use in electronic media because of their thin profile, low weight, and low driving voltage, i.e., less than about 20 volts. OLEDs have potential use in applications such as backlighting of graphics, pixelated displays, and large emissive graphics.

OLEDs typically consist of an organic light emitter layer and additional organic charge transport layers on both sides of the emitter, all of which are sandwiched between two electrodes: a cathode and an anode. The charge transport layers comprise an electron transporting layer and a hole transporting layer. Charge carriers, i.e., electrons and holes, are injected into the electron and hole transporting layers from the cathode and anode, respectively. Electrons are negatively charged atomic particles and holes are vacant electron energy states that behave as though they are positively charged particles. The charge carriers migrate to the emitter layer, where they combine to emit light.

FIG. 1 illustrates a type of organic light emitting diode. The diode comprises a substrate 12, a first electrode (anode) 14, a hole transporting layer 16, a light emitting layer 18, an electron transporting layer 20, and a second electrode (cathode) 22.

Substrate 12 may be transparent or semi-transparent and may comprise, e.g., glass, or transparent plastics such as polyolefins, polyethersulfones, polycarbonates, polyesters, and polyarylates.

Anode 14 is electrically conductive and may be optically transparent or semi-transparent. Suitable materials for this layer include indium oxide, indium-tin oxide (ITO), zinc oxide, vanadium oxide, zinc-tin oxide, gold, copper, silver, and combinations thereof.

An optional hole injecting layer (not shown) may accept holes from anode layer 14 and transmit them to hole transporting layer 16. Suitable materials for this layer include porphyrinic compounds e.g., copper phthalocyanine (CuPc) and zinc phthalocyanine.

Hole transporting layer 16 facilitates the movement of holes from anode 14 to emitter layer 18. Suitable materials for this layer include, e.g., aromatic tertiary amine materials described in U.S. Pat. Nos. 5,374,489 and 5,756,224, such as 4,4',4"-tri(N-phenothiazinyl) triphenylamine (TPTTA), 4,4',4"-tri(N-phenoxazinyl) triphenylamine (TPOTA), N,N'-diphenyl-N,N'-bis(3-methylphenyl)[1,1'-biphenyl]-4,4'-dia (TPD), and polyvinyl carbazole.

Emitter layer 18 comprises an organic material capable of accomodating both holes and electrons. In emitter layer 18, the holes and electrons combine to produce light. Suitable materials for this layer include metal chelate compounds, such as, e.g., tris(8-hydroxyquinolinato) aluminum (AlQ). The emission of light of different colors may be achieved by the use of different emitters and dopants in the emitter layer as described in the art (see C. H. Chen, J. Shi, and C. W. Tang "Recent Developments in Molecular Organic Electroluminescent Materials", *Macromolecular Symposia* 1997 125, 1–48).

Electron transporting layer 20 facilitates the movement of electrons from cathode 22 to emitter layer 20. Suitable materials for this layer include, e.g., AlQ, bis(10-hydroxybenzo(h)quinolinato) beryllium, bis(2-(2-hydroxy-phenyl)-benzolthiazolato) zinc and combinations thereof.

An optional electron injecting layer (not shown) may accept electrons from the cathode 22 and transmit them to the emitter layer 20. Suitable materials for this layer include metal fluorides such as LiF, CsF, as well as $SiO_2$, $Al_2O_3$, copper phthalocyanine (CuPc), and alkaline metal compounds comprising at least one of Li, Rb, Cs, Na, and K such as alkaline metal oxides, alkaline metal salts, e.g., $Li_2O$, $Cs_2O$, and $LiAlO_2$.

Cathode 22 provides electrons. It may be transparent. Suitable materials for this layer include, e.g., Mg, Ca, Ag, Al, alloys of Ca and Mg, and ITO.

Polymer OLEDS may be made wherein a single layer of poly(phenylenevinylene) (PPV) or poly(2-methoxy-5-(2'-ethylhexyloxy)-1,4-phenylene vinylene) (MEH-PPV) functions as layers 16, 18, and 20.

Illustrative examples of known OEL device constructions include molecularly doped polymer devices where charge carrying and/or emitting species are dispersed in a polymer matrix (see J. Kido, "Organic Electroluminescent devices Based on Polymeric Materials," *Trends in Polymer Science*, 1994, 2, 350–355), conjugated polymer devices where layers of polymers such as poly(phenylenevinylene) act as the charge carrying and emitting species (see J. J. M. Halls, D. R. Baigent, F. Cacialli, N. C. Greenham, R. H. Friend, S. C. Moratti, and A. B. Holmes, "Light-emitting and Photoconductive Diodes Fabricated with Conjugated Polymers," *Thin Solid Films*, 1996, 276, 13–20), vapor deposited small molecule heterostructure devices (see U. S. Pat. No. 5,061,569, incorporated by reference, and C. H. Chen, J. Shi, and C. W. Tang, "Recent Developments in Molecular Organic Electroluminescent Materials," *Macromolecular Symposia*, 1997, 125, 1–48), light emitting electrochemical cells (see Q. Pei, Y.Yang, G. Yu, C. Zang, and A. J. Heeger, "Polymer Light-Emitting Electrochemical Cells: In Situ Formation of Light-Emitting p-n Junction," *Journal of the American Chemical Society*, 1996, 118, 3922–3929), vertically stacked organic light-emitting diodes capable of emitting light of multiple wavelengths (see U. S. Pat. No. 5,707,745, incorporated by reference, and Z. Shen, P. E. Burrows, V. Bulovic, S. R. Forrest, and M. E. Thompson, "Three-Color, Tunable, Organic Light-Emitting Devices," *Science*, 1997, 276, 2009–2011).

SUMMARY OF INVENTION

The present invention relates to a method for adding a buffer layer comprising an intrinsically conducting polymer adjacent to an electrode layer in an organic electronic device such as an OLED to increase performance reliability. For example, the buffer layer may be between the anode layer and hole transporting layer. In particular it can improve the performance of OLEDs that rely upon vapor-coated indium tin oxide as an anode. Adding such a buffer layer to an organic electronic device can reduce or eliminate performance failures such as electrical shorts and non-radiative regions (dark spots).

Unexpectedly, the inventors found they were able to obtain a thin, uniform, smooth polymeric buffer layer by using web coating methods such as microgravure or meniscus coating. Because these coating methods can be used in a continuous process, they enable; adding a beneficial buffer layer to large area OLED substrates and continuous substrate sheets.

For applications requiring large area displays, it becomes more and more difficult to control the number of defects on a substrate or electrode layer. Because the buffer layer of the present invention can minimize the effects that these imperfections have on OLED performance, it enables the production of reliable large area OLEDs, (e g., those having an, area of 250 $cm^2$ or more, or at least one dimension greater than 25 cm).

One aspect of the present invention features an organic electronic device having a buffer layer, comprised of a doped conducting polymer, adjacent to an electrode layer. The conducting polymer may be externally doped or self doped. The electrode may be an anode comprised of indium tin oxide. The organic electronic device may have a flexible substrate, which may be comprised of materials such as, e.g. poly(ethylene terephthalate), polycarbonate, polyolefin, poly(methyl methacrylate), poly(styrene), polyester, polyolefin, polysulfone, fluoropolymer, polyimide, and hybrids, blends, or derivatives of these polymers.

Another aspect of the invention is a method for coating an electrode-coated substrate with a buffer layer by using microgravure or meniscus coating techniques. With such techniques, buffer layers of 500 to 5000 Å are possible. The smoother the substrate the thinner the buffer layer may be. Preferably, the buffer layers are 500 to 2000 Å thick.

A further aspect of the present invention provides methods, including a continuous method, of applying the conducting polymer to a large article or sheet of electrode-coated substrate, which may be used in large area organic electronic devices. The method can be used with flexible substrates in a continuous manner, thereby enabling the use of a roll-to-roll manufacturing process. In such a process, the sheet of electrode-coated substrate is continuously dispensed from a roll, passes through the coating area, and wound onto another roll.

As used in this specification:

"dopant" means an additive used to modify the conductivity of a polymer; for example, the imine nitrogen of a polyaniline molecule in its base form may be protonated upon exposure of the polyaniline to an acidic solution thereby converting the polyaniline to its conducting form; the acid providing the proton may be referred to as the dopant;

"externally doped" means a polymer is exposed to an added substance that can change the polymer's conductivity; for example, an acidic solution can provide a hydrogen ion to dope a polyaniline molecule and can concurrently provide a counterion that is ionically, but not covalently, bonded to the polymer molecule;

"self doped" means that the doping moiety is covalently bonded to the polymer being doped;

"intrinsically conducting" means an organic polymer that contains polyconjugated bond systems and that can act as an electrical conductor in the absence of external conductive materials such as metal particles, carbon black, etc.;

"small-molecule OLED" means a multilayer heterostructure OLED having its nonpolymer layers vapor deposited onto an electrode substrate in a vacuum chamber, wherein "non-polymer" refers to low molecular weight discrete compounds that can be thermally vaporized without causing significant decomposition or other chemical changes;

"web" means a continuous moving support that can carry a substrate past a coater or coating station;

"web coating method" refers to a coating method suitable for continuously coating a continuous sheet of substrate or a series of discrete substrate articles.

An advantage of at least one embodiment of the present invention is the reduction of defects in an OLED due to a reduction in electrical shorting achieved by coating a buffer layer as described herein on an OLED electrode layer.

Another advantage of at least one embodiment of the present invention is the ability to make a large area buffer-coated anode/substrate using a continuous roll-to-roll process. A roll-to-roll-process for this step can allow for increased production and reduced cost in producing organic electronic devices.

DETAILED DESCRIPTION

When the buffer layer of the present invention is used in an organic electronic device such as an organic light emitting diode (OLED), the benefits to performance reliability include reducing or eliminating performance failures such as electrical shorts and non-radiative regions (dark spots). Typical performance failures are described in Antoniadas, H., et al., *Failure Modes in Vapor-Deposited Organic LEDs, Macromol. Symp.*, 125, 59–67 (1997). The performance reliability of OLEDs can be influenced by a number of factors. For example, defects in, particles on, and general variations in the morphology at the surface of the materials comprising the substrate and electrode layers can cause or exacerbate performance failures that can occur in OLEDs. This is especially a problem with small-molecule vapor deposited lamps such as those described in U.S. Pat. Nos. 5,061,569 and 5,719,467, both incorporated by reference.

Small-molecule OLEDs are typically coated using a line-of-sight vapor deposition process. Particles or defects on the surface of the substrate or electrode surface may prevent the electrode surface from being coated uniformly during the line-of-sight vapor deposition process. A non-uniform coating can result in electrical shorting or can cause shadowed regions. Shadowed areas provide pathways for water, oxygen, and other detrimental agents to come into contact with and degrade the various lamp layers. This degradation can lead to dark spots which can grow into larger and larger non-emissive regions. The planarization provided by a conformal buffer layer can mitigate these imperfections.

Figure 1:
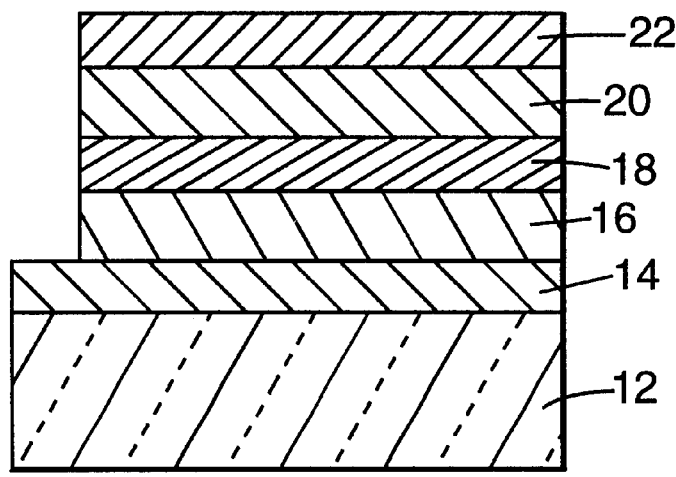
FIG. 1 depicts the general structure of a type organic light emitting diode.
Figure 2:
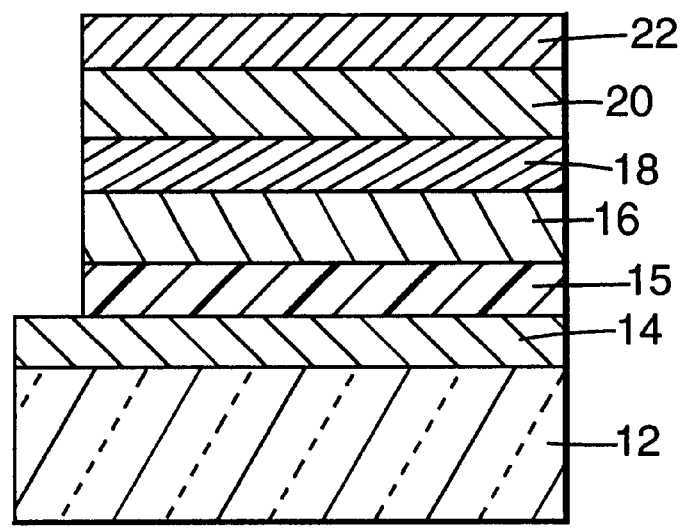
FIG. 2 depicts the OLED of FIG. 1 with the buffer layer of the present invention.

FIG. 2 illustrates an OLED structure comprising the OLED of FIG. 1 with buffer layer 15 of the present invention. Buffer layer 15 may comprise any type of conducting polymer, preferably an instrinically conducting polymer such as polyanline, polypyrrole, and polythiophene and blends of three materials with other polymers such as polyvinyl acetate (PVA) and polymethylmethacrylate (PMMA), more preferably a self-doped polyanline as described in copending U.S. patent application Ser. No. 09/390088. Buffer layer 15 can advantageously diminish or eliminate the detrimental effects in the performance of an OLED caused by imperfections and particles on the substrate of electrode surface. The buffer layer may be applied having a thickness sufficient to minimize imperfections such as physical protrusion, pitting, and large particles on the substrate or electrode surfaces, but not so thick as to decrease materially the efficiency of the device. Imperfections can cause problems such as short-circuiting, loss of emitted light, and interference with the successful application of subsequent layers. It is believed that the doped polymer coats the substrate in a conformal manner thereby reducing or eliminating the deleterious effects of imperfections and irregularities on the substrate or electrode surface.

Imperfections and irregularities can also be exacerbated by using flexible, transparent substrate materials such as polyethylene terephthalate (PET), polycarbonate, poly (methyl methacrylate), poly(styrene), polyester, polyolefin, polysulfone, fluoropolymer, polyimide, and hybrids, blends, or derivatives of these polymers. These types of materials tend to be rougher than some inflexible substrates such as glass. In addition, vapor deposition methods by which an electrode layer, e.g., an anode layer comprising ITO, is applied to the flexible substrate can cause the electrode surface to be rough. The inventors were able to minimize the detrimental effects of imperfections on a substrate having an anode layer by applying the material forming the buffer layer on the anode layer at thicknesses of up to 2000 Å. Thicknesses of up to 5000 Å may be used. The layer only needs to be thick enough to cover any imperfections.

When lit by applied DC voltage, OLEDs made with the buffer layer of the invention showed a significant reduction in the number of electrical shorts as compared to OLEDs having no buffer layer. This reduction in electrical short-outs allowed for the production of reliable large OLED lamps, including OLEDs made from flexible sheets of substrate/ anode materials coated with the buffer layer of the invention by the continuous roll-to-roll method of the invention.

Unexpectedly, the inventors found that they were able to achieve a smooth, thin, uniform, and conforming buffer layer by using polymer coating techniques other than spin coating, which is normally used to coat OLED polymer layers. Suitable polymer coating methods include, e.g., gravure coating, including rotogravure and microgravure coating, meniscus coating, spraying, electrospraying, e.g., as described in U. S. Pat. No. 4,748,043, dipping, bar coating, knife coating, curtain coating, kiss coating, air blade coating, extrusion coating, slide coating, slot coating, electrostatic coating, roll coating, including reverse roll and roll-over-roll coating, precision roll coating, flexographic printing, and combinations of any of these methods. Other suitable coating methods are described in Liquid Film Coating (Stephen F. Kistler and Peter M Schweitzer, editors, Chapman and Hill, 1997) and Modern Coating and Drying Technology (Edward Cohen and Edgar Gutoff, editors, VCH Publishers, 1992). Microgravure and meniscus coating methods are preferred. Direct and offset microgravure coating are described, for example, in U.S. Pat. No. 5,710,097, Example 2; U.S. Pat. No. 5,750,641, Example 3, and U.S. Pat. No. 5,725,989, Example 5, all of which patents are incorporated by reference. Meniscus coating is described, for example, in U. S. Pat. No. 5,270,079, incorporated by reference. Unlike spin coating, these coating methods can advantageously be used in a continuous coating process.

Spin coating is a batch process in which a liquid film is spread onto a rotating substrate by centrifugal force. The substrate is rotated at high speeds, typically from 1,000 to 10,000 rpm. Very thin and uniform coatings can be obtained with spin coating. However, the need to rotate the substrate at high speeds, which necessitates a chamber to contain any excess coating liquid, limits the size of the substrate that can be practically coated by this technique. In addition, the excess coating liquid can be difficult to recover and recycle. Thus, for efficient, large volume production, it is desirable to have a continuous coating process, such as a web coating process, that can provide coatings of similar quality to spin coating. It is also desirable to have a coating method that can be adapted to a batch coating method that consumes less coating solution than spin coating.

Many web coating methods used in the present invention can advantageously be adapted to batch coating processes such that discrete articles may also be coated by the method of the present invention. For example, bar coating, dip coating, spray coating, and other methods may be used in a batch process. For a batch process individual articles can be coated by moving the coating head over a stationary substrate article (see, e.g., Example 2) or by moving the article under a stationary coating head, as described, for example, in U.S. Pat. No. 4,984,532, incorporated by reference.

A related advantage of the coating methods of the present invention is that they can provide layers from approximately 5000 Å to as little as 500 Å thick or less. Coating such thin layers allows the production of thin, small devices. However, it is preferable that the layers are no so thin that the coatings are not conformal and uniform and do not cover defects. Also, it should be kept in mind that some materials become less transparent when applied in a thick layer. Thick layers may also diminish the electrical performance and efficiency of the device. Preferably, the coated layers are 500 to 2000 Å thick.

The buffer layer material may be applied from an aqueous or organic solution, depending on its solubilities. To ensure that the buffer layer is well-adhered to the electrode layer, the electrode layer may be pre-treated to make it sufficiently hydrophilic to be wetted by an aqueous solution or sufficiently hydrophobic to be wetted by an organic solution. Methods of treating the anode layer include treating the surface with $O_2$ plasma, applying hydrofluoric acid, or applying a strong base such as sodium hydroxide or tetramethyl ammonium hydroxide. A combination of surface treatments may be used.

After the buffer layer has been applied, it should be dried to remove the coating solvent (e.g., water). The buffer layer may be dried by exposure to ambient conditions. Faster drying times may be achieved by, e.g. applying heat, applying inert gas, or applying a vacuum.

Because these described coating methods can be used in a continuous process, they enable the production of buffer-coated substrates for large area organic electronic devices. Constructing a spin coater that could accommodate large area organic electronic devices would be impractical and costly. The coating methods enable convenient and cost-effective application of a buffer coating to large area articles, for example, those that will not easily fit into a spin coater typically used in the silicon electronics industry. Large area articles may generally have an area of at least 250 $cm^2$, generally at least 500 $cm^2$, more generally at least 1000 $cm^2$. A large area article would also include an article whose longest dimension (e.g., length-wise or diagonally) is 25 cm or more, generally 50 cm or more, more generally 1 m or more. Although it might be possible to build a spin coater to accommodate large articles, the larger the article, the more costly and impractical it becomes to use a spin coater. The coating methods also readily allow the use of continuous sheets of substrate material. Continuous sheets can be as wide as the conveying equipment will allow, such as 10 cm, 50 cm, or more. If flexible substrate material is used, a roll-to-roll feed and up-take processing method may be employed. A large article or sheet of buffer-coated substrate may then be cut into discrete articles having designated shapes and sizes for diverse applications.

The buffer-coated substrate may then be further processed, for example, to make an OLED, e.g., as described in U.S. Pat. Nos. 5,747,182 and 5,747,183, both incorporated by reference, or organic transistors, as described in U.S. Pat. Nos. 5,574,291 and 5,596,208, both incorporated by reference.

EXAMPLES

This invention may be illustrated by way of the following examples.

Unless otherwise specified, all chemicals were obtained from Aldrich Chemicals, Milwaukee, Wis. Tris(8-hydroxyquinolinato)aluminum (AlQ) was obtained from Dojindo Laboratories, Kumamoto, Japan. Glass substrates coated with indium-tin oxide (ITO) have nominal sheet resistance of 10–100 ohm/square and ITO thickness of 300–1500 Å. Flexible ITO-coated poly(ethylene terephthalate) (PET) substrates have nominal sheet resistance of 10–100 ohm/square and ITO thickness of 400–1400 Å.

Vacuum deposition for preparation of an OLED was carried out in an evaporator vacuum chamber equipped with an oil diffusion pump to operate at a base pressure of 10 microtorr and six evaporant sources that were heated by resistive heating. Deposition rates were monitored using an oscillating-crystal thickness monitor (Inficon XTC/2, Leybold Inficon, East Syracuse, N.Y.). The substrate was nominally kept at 23° C.

Comparative Example 1
Externally-Doped Polyaniline on Glass Substrate

An ITO-coated glass substrate, 5 cm×7.6 cm×1 mm (Thin Film Devices, Inc., Anaheim, Calif.) was rinsed with methanol and dried under a nitrogen flow. After treating the substrate with an oxygen plasma for 4 minutes at 50 Watts and 200 millitorr of oxygen in a reactive ion etcher (Micro-RIE series 80, Technics, Inc., Dublin, Calif.) it was placed in a spin-coater (Headway Research, Inc., Garland, Tex.), covered with xylene, and spun dry. A xylene solution of sulfonic-acid doped polyaniline (5% solids by weight, non-commercial sample supplied by Monsanto Co., St. Louis, Mo.) was applied through a 0.2 $\mu$m TEFLON filter (Gelman Sciences, Ann Arbor, Mich.) to cover the slide. The slide was spun at 5000 rpm for 20 seconds to give a polyaniline film approximately 500 Å thick. The coated slide was placed in an evaporator vacuum chamber and the chamber was sealed and evacuated to approximately $4\times10^{-7}$ torr. A light-emitting construction was prepared on the polyaniline surface by vacuum deposition, in the following order, of: 200 Å N,N'-bis(3-methylphenly)-N,N'-diphenylbenzidine (TPD) hole transport layer, at 2 Å/sec; 350 Å AlQ electron transport layer, at 3 Å/sec; 10 Å lithium fluoride, at 1 Å/sec; 5800 Å aluminum, at 60 Å/sec; and 2200 Å indium, at 70 Å/sec. On removal from the chamber, the device was connected to an electrical source and operated at 20 mA/cm² at an applied voltage of 7.1 V. Light was emitted with an external quantum efficiency (QE) of 1.35%. The light output intensity of the device was 803 candela/m², as measured by a United Photodetectors model #PIN-10D silicon photodetector (UDT Sensors, Hawthorne, Calif.). The electroluminescence emission spectrum of the lamp was identical to the photoluminescence spectrum of AlQ, as measured using a calibrated SD1000 fiber optic spectrometer (Ocean Optics, Inc., Dunedin, Fla.). The light output was uniform over the entire device and the device was free of short circuits.

Comparative Example 2
Externally-Doped Polyaniline and Copper Phthalocyanine on Glass Substrate A polyaniline-coated ITO-coated glass substrate, 5 cm×7.6 cm×1 mm, was prepared as in Comparative Example 1 except 130 Å of CuPc was deposited on the ITO-coated substrate at 2 Å/sec prior to the deposition of the remaining layers. On removal from the coating chamber, the device was connected to an electrical source and operated at 20 mA/cm² at an applied voltage of 6.1 V. Light was emitted with an external quantum efficiency of 0.91%. Light output intensity of the device was 543 candela/m². The light output was uniform over the entire device and the device was free of short circuits.

Example 1
Externally-Doped Polyaniline on Flexible Substrate

ITO-coated poly(ethylene terephthalate) (PET) was prepared by treating about 7.6 m of 0.125 mm thick PET film, 15.2 cm wide, in a vacuum roll coater using DC planar magnetron sputtering at a pressure of $8\times10^{-3}$ torr using a sputter gas of 95% argon and 5% oxygen. The ITO sputter target was a 99.99% pure ceramic comprising 90% $In_2O_3$ and 10% $SnO_2$, having a density of 90%. Sputtering took place at 280 watts and 350 volts, with a current of 0.80 amperes. The film was processed through the coater at a rate of 16 cm/min. The coated film exhibited a quarterwave reflectance maximum at 550 nm. Sheet resistance of the coated film ranged from 71 to 83 ohm/square.

The substrate was rinsed with deionized water, dried under a nitrogen stream, then placed in a micro-gravure coater (CAG-150-UV, Yasui Seiki USA Co., Bloomington, Ind.) equipped with a Tri-Helical roller (a Quad roller may alternatively be used) and a three-stage oven. The oven stages were set at 37.8° C., 48.9° C., and 26.7° C., respectively, starting with the stage nearest the coater exit. The doped polyaniline solution described in Comparative Example 1 was applied through a 0.2 $\mu$m filter then transferred into a trough for microgravure coating. The substrate was coated in a reverse mode at a line speed of 9.4 m/min. The resulting doped polyaniline film was approximately 2000 Å thick. A portion of the coated substrate measuring approximately 12.7 cm×17.8 cm was cut from the coated substrate and placed in an evaporator vacuum chamber and coated with the light-emitting construction as described in Comparative Example 1, except that 500 Å of aluminum was deposited and that the final indium layer was omitted. The buffer layer was uniform and homogeneous and the sample device was free of electrical shorts and emitted light uniformly at 3 mA/cm² at an applied voltage of 25 V.

The results of Example 1 and Comparative Example 1 show that web coating processes are as effective as spin coating for the application of a polymer buffer layer. Web coating methods allow large lamp substrates to be easily coated in a continuous manner, thereby enabling the large scale manufacture of OLED films.

Example 2
Coating of Self-Doped Polyaniline on Flexible Substrate

A flexible ITO-coated PET substrate (Southwall Technologies, Palo Alto, Calif.) measuring approximately 5 cm×15 cm was wiped clean with ethyl alcohol on a soft cloth, then soaked for 30 seconds in a metal ion-free developer solution (Shipley 319, Shipley Div. of Rohm and Haas, Marlboro, Mass.), then rinsed with deionized water. The substrate was clamped onto a glass plate in a flexographic ink proofing unit (The Precision Proofer, manufactured by Precision Proofing Co., West Monroe, La. and described in U.S. Pat. No. 4,984,532) that was equipped with a two-roll microgravure offset coating head (Precision Hand Proofer, Pamarco, Inc., Roselle, N.J.). A bead of unfiltered water-soluble 75% sulfonated self-doped polyaniline (Aldrich) was placed on the ITO-coated substrate in front of the microgravure roller and a coating of the polyaniline solution was applied to the substrate by moving the roller over the substrate at a constant speed and pressure. Hot air drying gave a dry, coated substrate with a polyaniline layer approximately 800 Å thick. The coated sample was placed in an evaporation chamber and the chamber was sealed and evacuated to approximately 7 pTorr. A light-emitting construction was prepared on the polyaniline surface by vacuum deposition, in the following order, of: 100 Å copper phthalocyanine (CuPc), at 1 Å/sec; 200 Å N,N'-bis(3-methylphenly)-N,N'-diphenylbenzidine (TPD), at 1 Å/sec; 350 Å AlQ, at 1 Å/sec; 10 Å lithium fluoride, at 1 Å/sec; and 1500 Å aluminum, at 10 Å/sec.

The sample device emitted light uniformly at 3 mÅ/cm$^2$ at an applied voltage of 15 V. It had a smooth, uniform surface, i.e., no visible blemishes or irregularities, and had no electrical shorts.

The 75% sulfonated polyaniline used in this experiment is no longer commercially available, but a 100% sulfonated polyaniline is available from Mitsubishi-Rayon, Co., Ltd., Tokyo, Japan.

The results of Example 2 and Comparative Example 2 show that web coating processes are as effective as spin coating for the application of a polymer buffer layer and that web coating methods can be adapted to coat stationary substrate pieces.

Other embodiments of the invention are within the scope of the following claims.

What is claimed is:

1. A large area organic electronic device comprising:
    a substrate having at least one continuous portion that has one or both of (1) a lengthwise dimension of 1 meter or more, and (2) a diagonal dimension of 1 meter or more; and
    an electrode layer on top of or underneath a buffer layer comprised of a doped conducting polymer.

2. The organic electronic device of claim 1 wherein the device is an organic light emitting diode.

3. The organic electronic device of claim 1 wherein the substrate is a flexible material.

4. The organic electronic device of claim 1 wherein the flexible substrate material is selected from the group consisting of polyesters, polycarbonates, poly(methyl methacrylate)s, poly(styrene)s, polyolefins, polyimides, fluoropolymers, polysulfones, derivatives thereof, and mixtures thereof.

5. The organic electronic device of claim 1 wherein the buffer layer is from 500 to 2000 Å thick.

6. The organic electronic device of claim 1 wherein the buffer layer comprises a polymer selected from the group consisting of polyaniline, polypyrrole, and polythiophene.

7. The organic electronic device of claim 1 wherein the buffer layer comprises self-doped polyaniline.

* * * * *

UNITED STATES PATENT AND TRADEMARK OFFICE
CERTIFICATE OF CORRECTION

PATENT NO. : 6,593,690 B1
DATED : July 15, 2003
INVENTOR(S) : McCormick, Fred B.

It is certified that error appears in the above-identified patent and that said Letters Patent is hereby corrected as shown below:

<u>Column 10,</u>
Line 21, "1" should read as -- 3 --.

Signed and Sealed this

Second Day of March, 2004

JON W. DUDAS
*Acting Director of the United States Patent and Trademark Office*